United States Patent [19]
Britton et al.

[11] Patent Number: 5,311,080
[45] Date of Patent: May 10, 1994

[54] FIELD PROGRAMMABLE GATE ARRAY WITH DIRECT INPUT/OUTPUT CONNECTION

[75] Inventors: Barry K. Britton, Schnecksville, Pa.; Dwight D. Hill, San Carlos, Calif.; William A. Oswald, Allentown, Pa.

[73] Assignee: AT&T Bell Laboratories, Murray Hill, N.J.

[21] Appl. No.: 37,766

[22] Filed: Mar. 26, 1993

[51] Int. Cl.$^5$ ............................................. H03K 19/177
[52] U.S. Cl. ........................................ 307/465; 307/443
[58] Field of Search ................. 307/443, 465, 465.1; 365/189.08

[56] References Cited

U.S. PATENT DOCUMENTS

| | | | |
|---|---|---|---|
| 4,642,487 | 2/1987 | Carter | 307/465 |
| 4,706,216 | 11/1987 | Carter | 307/465 X |
| 4,758,746 | 7/1988 | Birkner et al. | 307/465 |
| 4,758,985 | 7/1988 | Carter | 307/465 |
| 4,870,302 | 9/1989 | Freeman | |

OTHER PUBLICATIONS

"XC4000 Logic Cell TM Array Family", Product Description, Dec. 1991, pp. 1–19.
"A New Architecture for High-Performance FPGAs", Second International Workshop on Field Programmable Logic and Applications, Vienna, Austria, Aug. 31, 1992, pp. 1–8.
"A Fully Configurable Versatile Field Programmable Function Element", D. D. Hill, Case 2, Ser. No.: 07/679,370, Filed On: Apr. 2, 1991, pp. 1–20.
"Low-Skew Signal Routing in a Programmable Array", B. K. Britton, D. D. Hill, W. A. Oswald, Case 1-4-1, Ser. No.: 07/971,502, Filed On: Nov. 4, 1992, pp. 1–16.
"FPGA With Distributed Switch Matrix", B. K. Britton, D. D. Hill, W. A. Oswald, Case 2-5-2, Ser. No.: 08/019963, Filed On: Feb. 19, 1993, pp. 1–15.

Primary Examiner—David R. Hudspeth
Attorney, Agent, or Firm—James H. Fox

[57] ABSTRACT

A field programmable gate array that includes a dedicated path that directly connects an I/O pad to a selected register in the array of programmable function units. For example, a direct connection (i.e., without a configurable interconnect point) is provided from an I/O pad, through an input driver, to the input of a selected register in a given PFU. Either this same path, or alternatively a different path, may be used to directly connect a register output from a given PFU to an I/O pad, through an output driver. This technique avoids the need for special I/O registers in the programmable input/output cells, thereby increasing the flexibility of use and ease of design of the FPGA.

19 Claims, 3 Drawing Sheets

FIELD PROGRAMMABLE GATE ARRAY WITH DIRECT INPUT/OUTPUT CONNECTION

BACKGROUND OF THE INVENTION

1. Field of the Invention

The present invention relates to integrated circuits that include a field programmable gate array.

2. Description of the Prior Art

Integrated circuits (ICs) have traditionally implemented a single function, or else functions that were defined by software programming. However, in either case, the logic architecture that implemented the functionality was fixed during the design of the IC. More recently, integrated circuits have been developed whose logic architecture can be changed after manufacture. For example, Field Programmable Gate Arrays (FPGAs) have been developed whose logic functions can be established by the user. Referring to FIG. 1, a typical FPGA architecture is illustrated. The logic functions are typically done in Programmable Function Units (PFUs) 100, 101, 102, 103, which are alternatively referred to by workers in the art as Configurable Logic Blocks (CLBs). Each PFU includes various logic circuit elements (AND gates, OR gates, NAND gates, NOR gates, flip-flops, multiplexers, registers, latches, and tri-state buffers, for example) that may be connected in a desired arrangement in order to implement desired logic and memory functions. For example, typical logic functions include combinatorial logic, adders, counters, and other data path functions. The combinatorial logic may be performed using look-up tables (LUTs) or logic gates, whereas sequential logic is typically performed using storage elements (registers) such as flip-flops and latches.

As illustrated in FIG. 1, the PFUs are connected together by Routing Nodes (R-nodes), being illustratively the conductors in groups 104, 105, 106 and 107. In addition, Configurable Interconnect Points (CIPs) are used to connect two or more R-nodes together. The CIPs may be grouped as C-blocks (e.g., 108) and S-blocks (e.g., 109), whose functions are described below. (In a more recent type of FPGA design, a third set of conductors, referred to as "switching R-nodes" are used to make connections. These implement the functionality of the C-blocks and S-blocks in a manner that provides additional routing flexibility with a reduced total number of CIPs. However, more CIPs per path are typically required. Hence, the problems addressed herein are common to both types of designs). Due to their symmetric layout, FPGAs may conceptually be divided into more or less identical blocks of circuitry called Programmable Logic Cells (PLCs). For example, a given PLC (117) typically includes a single PFU (101), and the associated R-nodes and CIPs as described above. Around the periphery of the integrated circuit are programmable Input/Output cells (e.g., 111, 112), also referred to as "PIC" herein. These include Input/Output blocks (e.g., 113, 114, 115 and 116) that communicate externally to the integrated circuit via bondpads (e.g., 117, 118, 119, 120).

FIG. 2 then shows an example of how the connections inside the C-Block and S-Block can be implemented. In FIG. 2(A), a C-block is illustrated, wherein the vertical routing conductors 201 and 202 may be selectively connected to the horizontal routing conductor 203 by means of the CIPs 205 and 206. Similarly, the vertical routing conductors may be connected to the other horizontal conductors 204, 207, 208, 209 and 210 by the other CIPs illustrated. As shown in FIG. 2(A), each CIP is illustrated as a diamond, and typically comprises a field effect transistor having a first source/drain region connected to the vertical conductor, and a second source/drain region connected to the horizontal conductor. In FIG. 2(B), a typical S-block 250 is illustrated. The vertical conductor 251 is selectively connected to the horizontal conductor 253 by means of transistor 257, and to the horizontal conductor 254 by means of transistor 258. Similarly, the vertical conductor 263 is selectively connected to horizontal conductors 253 and 254 by means of transistors 259 and 260, respectively. The vertical conductors 251 and 263 are selectively connected together by transistor 262, whereas the horizontal conductors 253 and 254 are selectively connected together by transistor 261. In an analogous manner, the vertical conductors 252 and 264 and the horizontal conductors 255 and 256 may be selectively connected by the other transistors shown.

In the above embodiment, the gate of a given transistor is controlled by a register (not shown), or other means of storing the desired connectivity information. In the case of an n-channel transistor, when the gate voltage on the transistor is high, the transistor conducts, which connects the two conductors. When the gate voltage is low, the transistor does not conduct. The gate voltage is typically controlled by a program register or electronically-erasable programmable read-only memories (EEPROMs). However, in lieu of field effect transistors, these connections may alternatively be made by other means, including electrically blown fuses and anti-fuses, for example. However, a drawback to these configurable connections is that a signal takes a longer amount of time to propagate through them, as compared to connections made through continuous conductors only (i.e., without a CIP). For most sections of the circuit implemented by the FPGA, the extra delay for the configurable routing can be tolerated for internally-generated signals. However, an application's input/output (I/O) signals are the signals which connect to an I/O pad, typically through either an input or output driver, and tend to be more demanding. These signals are often clocked when going out of the integrated circuit chip, and latched when coming in; they typically must be very fast. This is especially true for the I/O signals that connect directly from an I/O pad to the input or output of a register.

This problem has been addressed in some previous FPGA architectures by placing dedicated registers near the input/output (I/O) pads in the PICs. As shown in FIG. 3, a typical PLC 300 is shown that includes a PFU 302, which supplies an output signal to the PLC routing resources 307, which then programmably supply it to the PIC 301. The "data" output signal is clocked via a special register, being flip-flop 303, and supplied to the I/O bondpad 306 via the output driver 305. The 4-to-1 multiplexer 304 allows for selection of the non-inverted Q output of flip-flop 303, or the inverted output via inverter 307. It also allows for the "data" signal, or inverted "data" signal via inverter 308, to bypass the flip-flop 303 so as to be supplied in unclocked form externally to the integrated circuit. As noted above, the placement of the flip-flop 303 near the output bondpad allows for high-speed clocking of the signal off the integrated circuit chip. Note however that the output signal must travel from the PFU to the PIC via the routing resources 303, which includes R-nodes and at least one CIP, as described above. A similar situation exists with regard to the input circuitry, as shown in FIG. 4. The PIC includes the I/O bondpad 401, which in practice may be physically the same as I/O bondpad 306 in the output circuit. The input signal is supplied via input buffer 402 to the special register 403, and then via the routing resources 404 to the PFU 405 in the PLC 406. Again, the routing resources 404 include R-nodes and at least one CIP. In both cases, the special registers can be accessed only by the I/O pads, and have different functionality from those in the internal FPGA.

As shown in both FIGS. 3 and 4, the registers (303,403) in the PICs tend to have fewer inputs (such as clock enables and local set/resets) than those in the PFUs. For example, the PFU 302 includes a register, being illustratively flip-flop 309, that can receive a signal from the look-up table 310, which allows for accomplishing combinatorial logic. The look-up table may be bypassed by the multiplexer 311 if desired, and either a local or global reset may be supplied via OR gate 312. The PFU output is supplied to the routing resources via output driver 313. It can be seen that the PFU 405 in FIG. 4 is identical with that shown for FIG. 3. (It will be appreciated by workers in the art that numerous other PFU designs are possible.) Also as shown, there is typically a direct connection from a LUT to each of the registers in each PFU. However, the LUT is not available for the registers in the PICs. Hence, this prior-art solution is undesirable for many reasons, especially because the special registers in the PICs waste area on the integrated circuit if the I/O signals do not need to be latched. Furthermore, the presence of the special registers makes the software needed to configure the FPGA more difficult to implement. This is because the software must handle two distinct types of registers, as well as the fact that some registers have fast connections to an associated LUT, whereas others do not. Therefore, it would be desirable to have a circuit design that does not exhibit these problems.

SUMMARY OF THE INVENTION

We have invented a field programmable gate array that includes a dedicated path that directly connects an I/O pad to a selected register in the array of programmable function units. For example, a direct connection (i.e., without a configurable interconnect point) is provided from an I/O pad, through an input driver, to the input of a selected register in a given PFU. Either this same path, or alternatively a different path, may also be used to directly connect a register output from a given PFU to an I/O pad, through an output driver.

DETAILED DESCRIPTION

Figure 3:
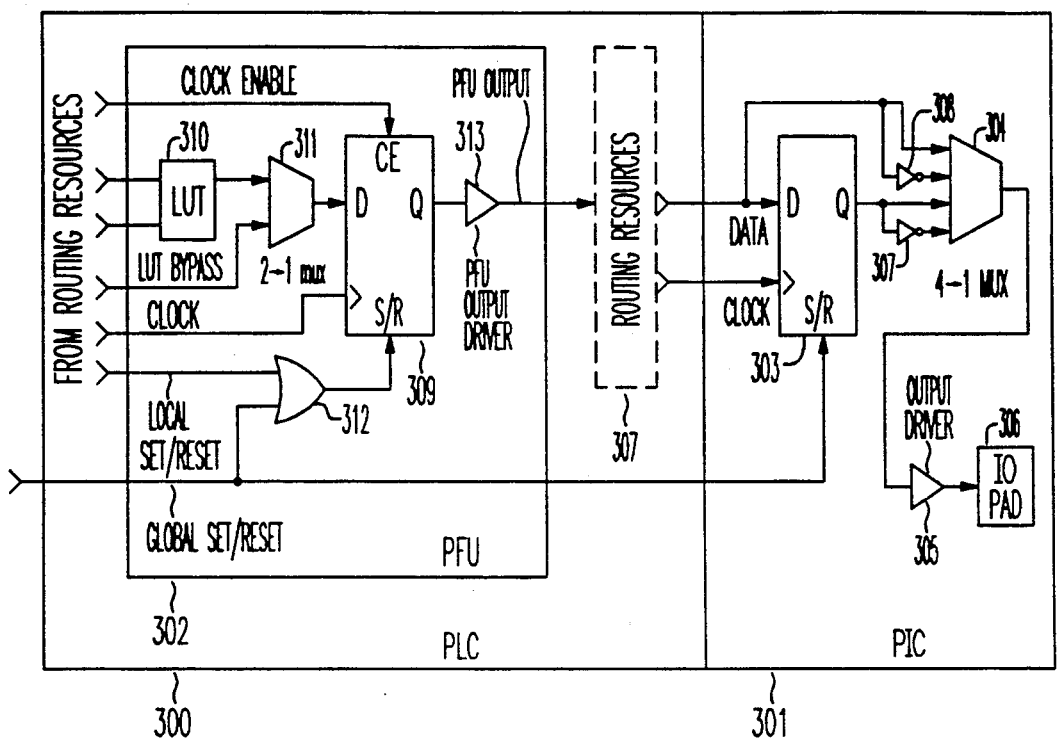
FIG. 3 shows a typical prior-art technique for including a special output register in a programmable input-/output cell.
Figure 5:
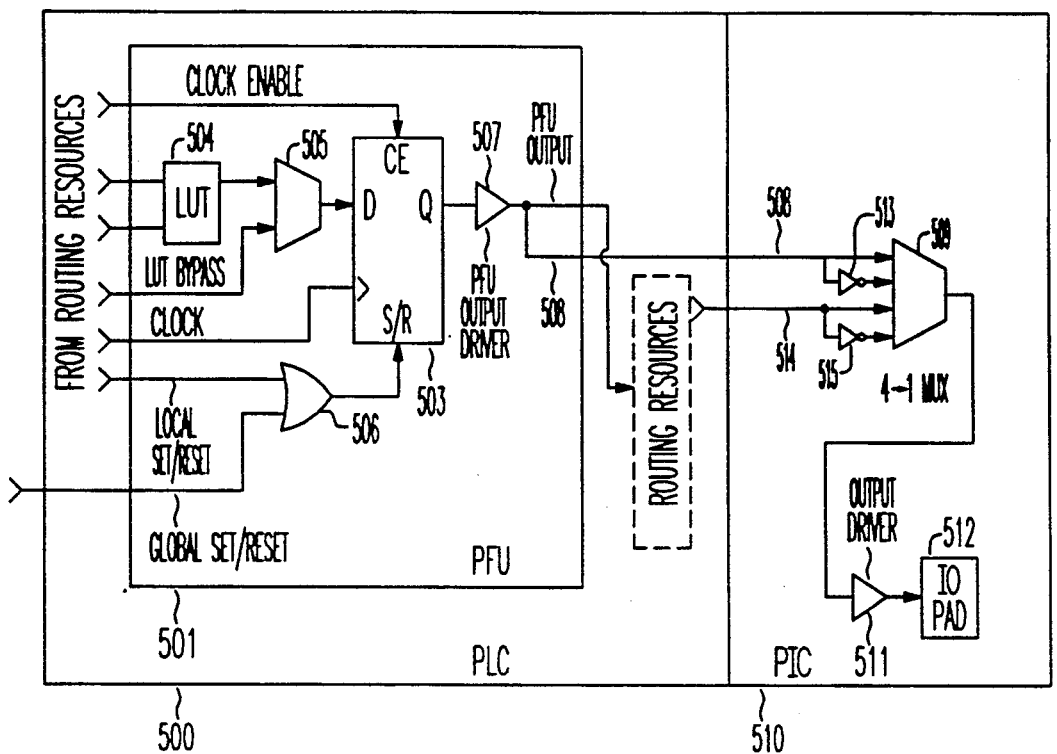
FIG. 5 shows the inventive direct connection from the output of a programmable function unit to an output bondpad.

The following detailed description relates to a field programmable gate array having direct connections between I/O pads and internal registers. Referring to FIG. 5, an illustrative programmable logic cell 500, including a programmable function unit 501 and routing resources 502, is illustrated. The PFU includes a register in the form of a flip-flop 503, with other register types being possible for use with the inventive technique. The PFU also illustratively includes a look-up table 504 that may be selectively bypassed via a 2 to 1 multiplexer 505 that provides an input to the register. Local and global set/reset signals are provided via an OR gate 506 to the set/reset input of the flip-flop. An output driver 507 provides a PFU output signal to the routing resources, which may be in the form of the R-nodes and CIPs described above. The routing resources typically communicate the PFU output to the input of one or more other PFUs in the array. As thus far described, the PLC is comparable to the prior-art design of FIG. 3.

However, in the present technique, when the PFU provides an output to a bondpad, it may do so via a dedicated path that does not include a configurable interconnect point. For this purpose, the direct connect conductor 508 provides a path directly from the flip-flop output in the PLC 500 to an input of the PIC 510. In the illustrative case, conductor 508 connects to the input of multiplexer 509, which selectively provides the signal from the PLC to the output driver 511 and I/O pad 512. Note that the 4-to-1 multiplexer 509 may select either the non-inverted output from the flip-flop, or the inverted output via the inverter 513. Alternatively, the multiplexer may select a non-inverted signal provided by the routing resources (which path includes one or more the CIPs) via conductor 514, or alternatively the inversion of such signal via the inverter 515. Hence, the inventive technique avoids routing the output signal through a CIP, allowing for high-speed clocking of the signal off of the integrated circuit.

Figure 4:
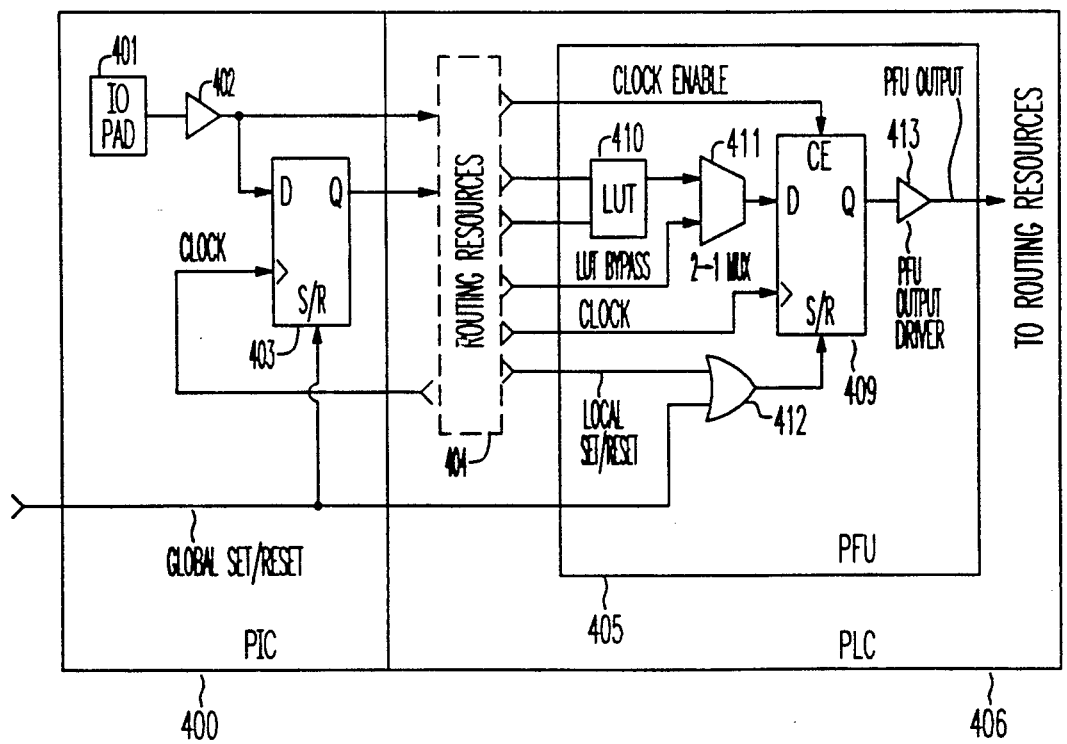
FIG. 4 shows a typical prior-art technique for including a special input register in a programmable input-/output cell.
Figure 6:
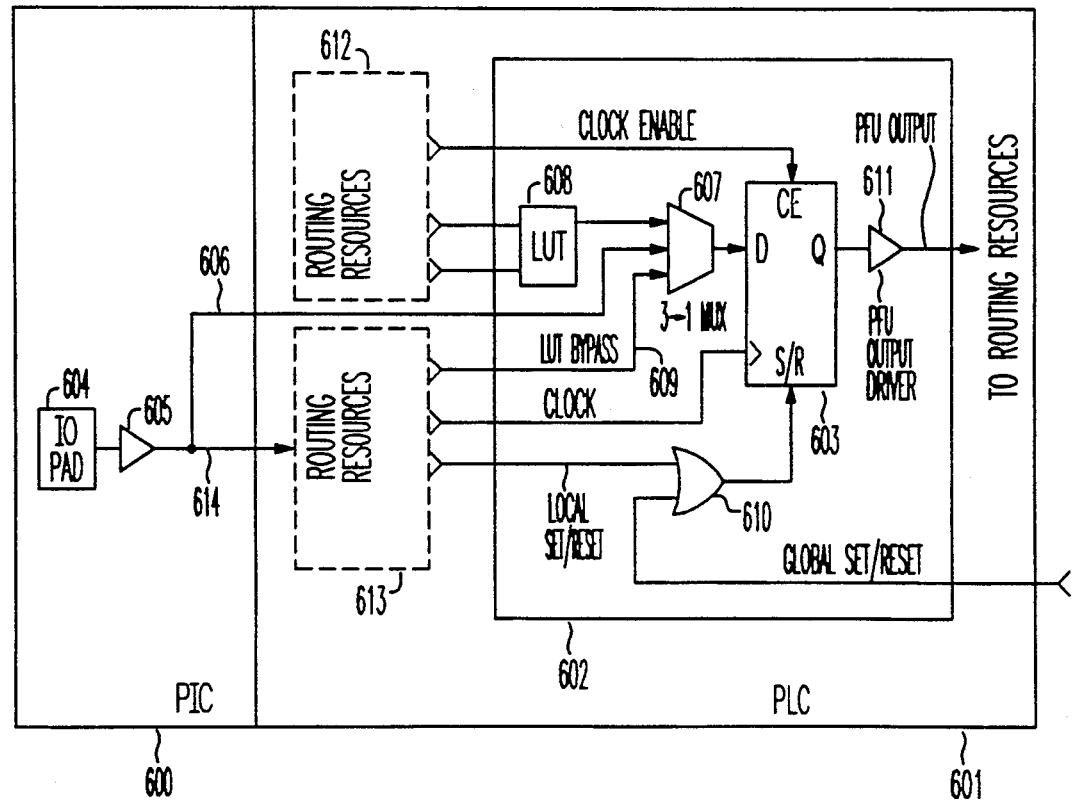
FIG. 6 shows the inventive direct connection from an input bondpad to the input of a programmable function unit.

Referring to FIG. 6, a comparable direct connection is also provided between the bondpad 604 in PIC 600 and an input of flip-flop 603 in the PFU 602, located in PLC 601. For this purpose, the conductor 606 provides a direct path from the output of driver 605 to the input of multiplexer 607, which selectively provides the input signal to the flip-flop 603. This path does not include any configurable interconnect points, and hence preserves the high speed of the input signal. The 3-to-1 multiplexer 607 may alternatively select the output of the look-up table 608, or a bypass signal 609. The local/global set/reset inputs are provided via OR gate 610, and the output driver 611 drives the PFU output onto the routing resources as before. Hence, it can be seen that the configuration of FIG. 6 avoids the use of a special register, as was required in the prior-art PIC of FIG. 4. The input driver 605 typically also provides the input signal to the R-nodes via conductor 614, for flexibility of use in the FPGA. Also, various other signals are still supplied to the PFU 602 via the routing resource nodes 612 and 613, so that the present technique maintains flexibility of programming while still providing high-speed latching of input signals.

Figure 1:
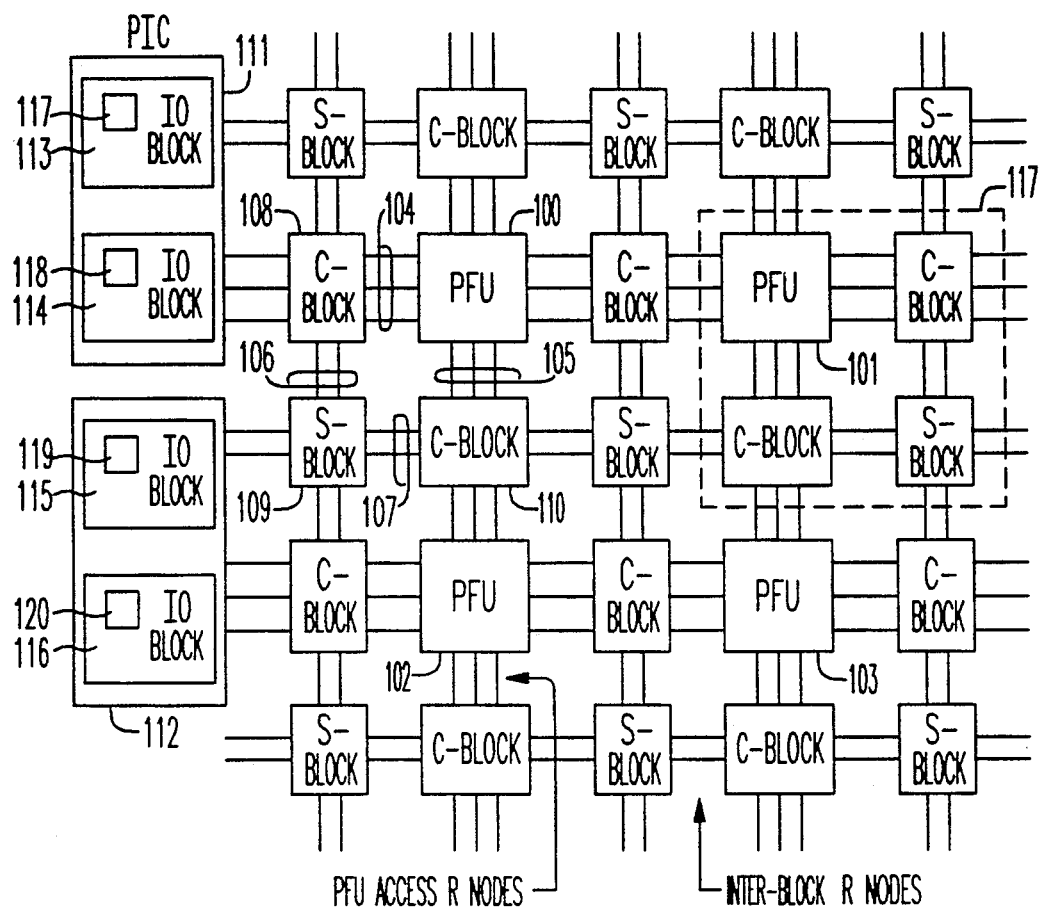
FIG. 1 shows a typical prior-art field programmable gate array.
Figure 2A:
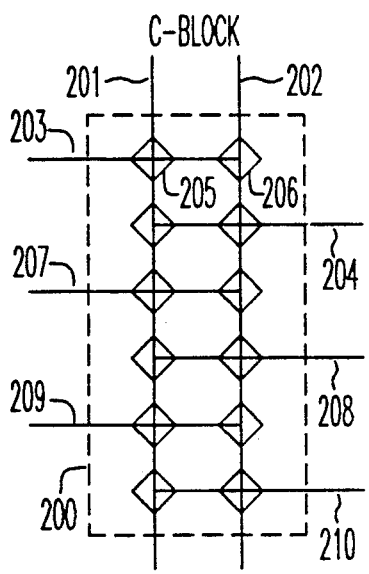
FIGS. 2A and 2B show typical prior-art programmable connection blocks that include configurable interconnect points (CIPs).
Figure 2B:
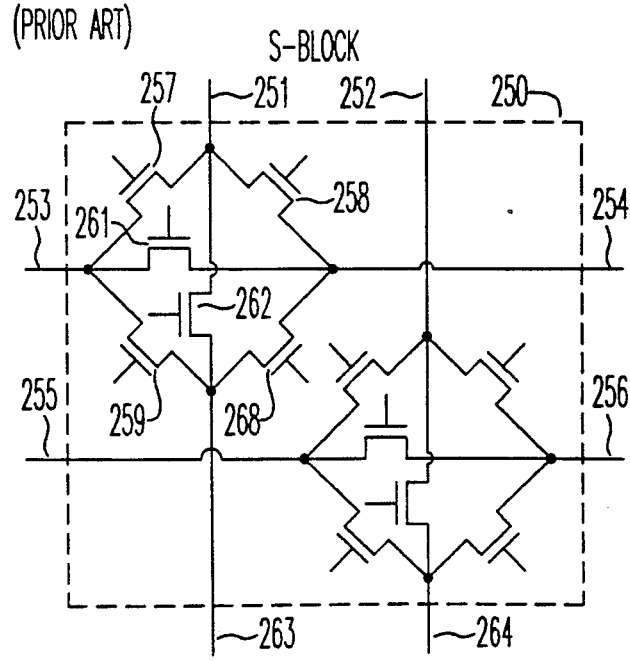

While the above embodiments have shown one look-up table and one flip-flop per PFU, in one current design four LUTs and four flip-flops are provide per PFU, allowing for a nibble-mode type of operation, wherein four data bits are provided by each PFU. In that case, four I/O bondpads and associated drivers are provided per PIC. In one current design, the register that serves as the sequential element (503, 603) may operate either as a flip-flop, or latch, as programmed by the user, taking advantage of the fact that a flip-flop is conventionally implemented as two latches. Also, while the above embodiments have shown the direct connection between the sequential element and the associated bondpad, the direct connection may alternatively, or additionally, be provided between the combinatorial element and the bondpad. For example, a direct output path between look-up table 504 and bondpad 512 can be provided, and a direct input path between bondpad 604 and look-up table 608 can be provided. In those cases, a multiplexer could choose whether the sequential logic element or combinatorial element is connected to the associated bondpad. Alternatively, separate bondpads could be devoted to both the sequential and combinatorial elements. While both local and global set/resets, as well as clock enables, may be applied to the flip-flops, both types are not needed in some designs. As indicated above, the present technique provides advantages whether used with the S-block and C-block type of interconnects, as shown in FIGS. 1 and 2, or with the switching R-node type of interconnects, or any other type that uses CIPs in the routing resources, as will be apparent to persons of skill in the art.

We claim:

1. An integrated circuit comprising a field programmable gate array having:
   a multiplicity of programmable logic cells comprising at least one programmable function unit comprising at least one logic element selected from the group consisting of combinatorial logic and sequential logic, and further comprising the associated routing resources, including routing conductors and configurable interconnect points; and
   a multiplicity of programmable input/output cells comprising at least one driver selected from the group consisting of input driver and output driver, and further comprising one or more associated bondpads;
   characterized in that said field programmable gate array further comprises a direct path between an input, or alternatively an output, of a given logic element in a given programmable function unit, and the input driver, or alternatively the output driver, respectively in a given programmable input/output cell.

2. The integrated circuit of claim 1 wherein said direct path is an output path from said given logic element, and includes a multiplexer for selectively providing a signal from at least one alternative path to said output driver.

3. The integrated circuit of claim 1 wherein said direct path is an input path to said given logic element, and includes a multiplexer for selectively providing a signal to said given logic element from at least one alternative path.

4. The integrated circuit of claim 1 wherein said given logic element is a combinatorial logic element.

5. The integrated circuit of claim 4 wherein said combinatorial logic element is a look-up table.

6. The integrated circuit of claim 1 wherein said given logic element is a sequential logic element.

7. The integrated circuit of claim 6 wherein said sequential logic element is a flip-flop.

8. The integrated circuit of claim 6 wherein said sequential logic element is a latch.

9. An integrated circuit comprising a field programmable gate array having:
   a multiplicity of programmable logic cells comprising at least one programmable function unit comprising at least one look-up table and at least one register, and further comprising the associated routing resources, including routing conductors and configurable interconnect points; and
   a multiplicity of programmable input/output cells comprising at least one output driver and associated bondpad;
   characterized in that said field programmable gate array further comprises a direct path between the output of a register in a given programmable function unit and an output driver in a given programmable input/output cell, and
   wherein said direct path includes a multiplexer for selectively providing a signal from at least one alternative path to said output driver.

10. The integrated circuit of claim 9 wherein said multiplexer selectively provides to said output driver a signal selected from the group consisting of: the output of said register, the inversion of the output of said register, a signal from said routing resources, and the inversion of said signal from said routing resources.

11. The integrated circuit of claim 9 wherein said programmable function unit further comprises means for providing the signal from said output of said register to said routing resources.

12. The integrated circuit of claim 9 wherein said register is a latch.

13. The integrated circuit of claim 9 wherein said register is a flip-flop.

14. The integrated circuit of claim 9 wherein said register may be programmably configured as either a latch or alternatively a flip-flop.

15. An integrated circuit comprising a field programmable gate array having:
   a multiplicity of programmable logic cells comprising at least one programmable function unit comprising at least one look-up table and at least one register, and further comprising the associated routing resources, including routing conductors and configurable interconnect points; and
   a multiplicity of programmable input/output cells comprising at least one input driver and associated bondpad;
   characterized in that said field programmable gate array further comprises a direct path between said input driver in a given programmable input/output cell and the input of said register in a given programmable function unit, and
   wherein said direct path includes a multiplexer for selectively providing a signal from at least one alternative path to said register.

16. The integrated circuit of claim 15 wherein said multiplexer provides a signal selected from the group consisting of: the output of said input driver, the output of said look-up table, and a signal from said routing resources that bypasses said look-up table.

17. The integrated circuit of claim 15 wherein said register is a latch.

18. The integrated circuit of claim 15 wherein said register is a flip-flop.

19. The integrated circuit of claim 15 wherein said register may be programmably configured as either a latch or alternatively a flip-flop.

* * * * *